United States Patent [19]

Tonnel

[11] 4,369,561
[45] Jan. 25, 1983

[54] PROCESS FOR ALIGNING DIFFUSION MASKS WITH RESPECT TO ISOLATING WALLS OF COFFERS IN INTEGRATED CIRCUITS

[75] Inventor: Eugene Tonnel, Paris, France
[73] Assignee: Thomson-CSF, Paris, France
[21] Appl. No.: 212,974
[22] Filed: Dec. 4, 1980

[30] Foreign Application Priority Data

Dec. 21, 1979 [FR] France ............................ 79 31483

[51] Int. Cl.³ ............................................ H01L 21/22
[52] U.S. Cl. .............................. 29/576 W; 29/576 B; 148/175; 148/187; 204/129.3
[58] Field of Search ...................... 29/576 W, 576 B; 148/1.5, 190, 187, 175; 204/129.3

[56] References Cited

U.S. PATENT DOCUMENTS

| | | | |
|---|---|---|---|
| 3,713,908 | 1/1973 | Agusta et al. | 148/175 |
| 3,846,192 | 11/1974 | Murrmann | 148/175 |
| 3,919,060 | 11/1975 | Pogge et al. | 204/129.3 |
| 3,954,523 | 5/1976 | Magdo et al. | 148/175 |
| 3,980,507 | 9/1976 | Carley et al. | 148/187 |
| 4,016,017 | 4/1977 | Aboat et al. | 148/187 |

FOREIGN PATENT DOCUMENTS 2633134 of 0000 Fed. Rep. of Germany .

OTHER PUBLICATIONS

IBM Technical Disclosure Bulletin, vol. 20, No. 6, Nov. 1977, New York (US), C. H. Lee, "Self-Aligning Subcollector and Isolation Regions in a Semi-Conductor Transistor", pp. 2233-2234.

*Primary Examiner*—G. Ozaki
*Attorney, Agent, or Firm*—Roland Plottel

[57] ABSTRACT

A process in which P+ impurities are implanted in a P silicon substrate at the periphery of N+ buried layers, prior to growing an N epitaxial layer. Then an upward diffusion of the P+ impurities is caused up to the surface of the wafer in order to form insulation walls insulating separate N coffers. An anodization followed with an oxidation transforms those P walls into silica walls and makes their upper surface visible.

7 Claims, 11 Drawing Figures

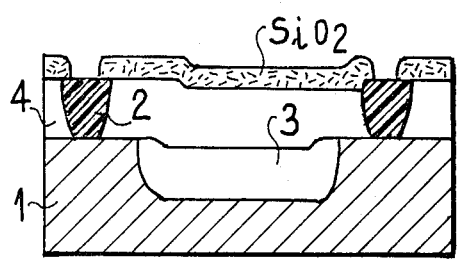
FIG_1
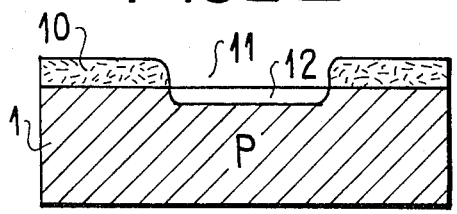
FIG_2
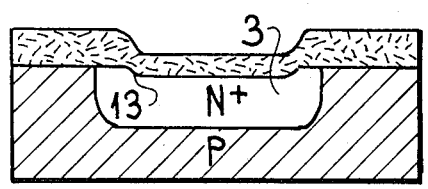
FIG_3
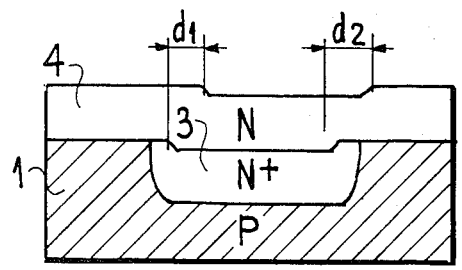
FIG_4
"PRIOR ART"
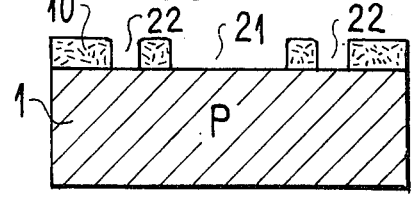
FIG_5
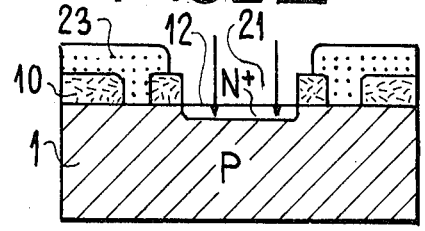
FIG_6
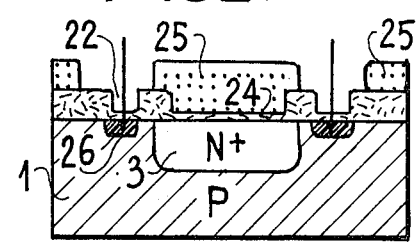
FIG_7
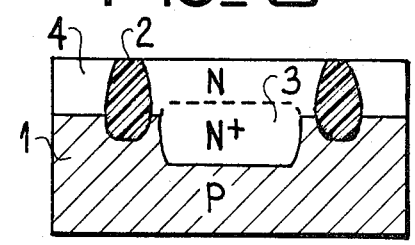
FIG_8
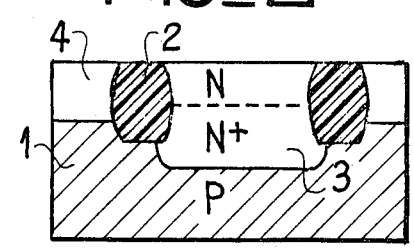
FIG_9

FIG_10
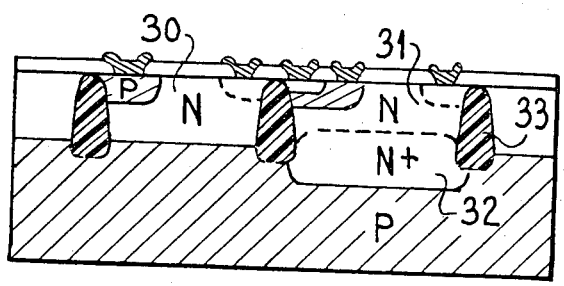
FIG_11
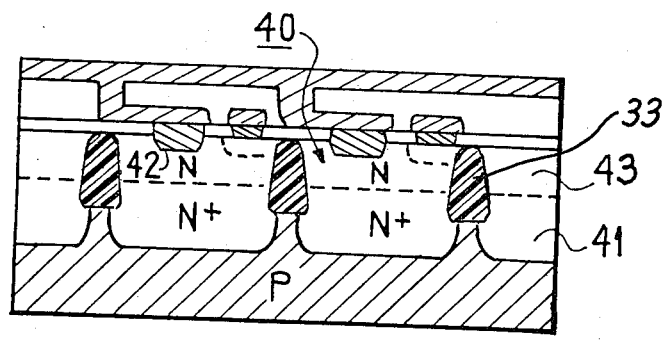

PROCESS FOR ALIGNING DIFFUSION MASKS WITH RESPECT TO ISOLATING WALLS OF COFFERS IN INTEGRATED CIRCUITS

BACKGROUND OF THE INVENTION

The present invention relates to a process for forming coffers in integrated circuits and integrated structures incorporating such coffers. It applies more particularly to bipolar integrated circuits in which the thickness of the epitaxial layer is of the order of a few microns only.

Generally, in the technique of bipolar integrated circuits, each elementary component of the integrated circuit is formed inside a coffer for ensuring operation of this component independently of the phenomena which may occur in the zones corresponding to the adjacent components.

FIG. 1 shows a bipolar integrated circuit coffer obtained conventionally. This coffer is formed on a semiconductor substrate, generally of silicon designated by reference 1. It is defined laterally by a P+ type zone 2 having a closed contour, generally square or rectangular in shape. Between the lower part of the coffer and substrate 1 there is frequently formed a buried layer 3 of the same type of conductivity as the coffer, and of the opposite type of conductivity to that of the substrate, for example of type N+ if the substrate is of type P and the coffer of type N.

Conventionally this coffer, of type N, is formed by implanting initially in substrate P, substantially at the positions of the layer intended to become the buried layer 3, high-concentration doping impurities, then by growing an epitaxial layer 4 on the substrate and finally by effecting through an appropriate mask a diffusion so as to form the isolating walls 2 of the coffer.

One of the technological difficulties which arises during production of the coffers described above with reference to FIG. 1, resides in the fact that, once the buried layer 3 has been formed, then the epitaxial layer 4 has been caused to grow, the positions of the buried layer 3 cannot be "seen" from the upper surface of the substrate. It is then very difficult to position the mask for locating the diffusion of the insulating walls so as to align it with the mask which served for forming the buried layer 3.

Different processes have already been thought up in the prior art to try and resolve this problem.

One of the known processes consists, as is shown in FIG. 2, in etching in an oxide layer 10 formed at the surface of substrate 1 openings 11 in which the buried layers 12 of type N+ will be implanted. In a second stage shown in FIG. 3, a heat treatment is carried out at high temperature in a slightly oxidizing atmosphere. During this operation, the more rapid growth of the silica layer at the level of the visible silicon of the buried layer causes a depression in the surface of the silicon above this buried layer. This difference of level causes a step 13 to appear which delimits the periphery of the buried layer. Since the orientation of this step is different from the rest of the surface of the substrate and since the epitaxial growth is anisotropic, the growth of the silicon will occur obliquely with respect to the step.

There will then be obtained at the surface of the epitaxied layer, as shown in FIG. 4, an image of the depression which will not be straight above the one formed in the substrate. Furthermore, since the crystalline orientation of the facing facets is different, the displacements $d_1$ and $d_2$ which they will undergo will also be different and the image of the depression at the surface will be not only displaced but further deformed.

Although it is possible, in strictly controlled conditions of epitaxial growth to obtain reproducible displacements and deformations, it appears that this method does not allow great accuracy to be obtained in the alignment of the etching which will define the insulating walls with respect to the underlying buried layer. Practically, by taking into account the constant displacement for given conditions of growth, it is not possible to ensure this alignment with an accuracy greater than $1\mu$ and this for epitaxied layers not exceeding $3\mu$ in thickness.

Another process of the prior art for positioning the insulating mask with respect to the buried layer consists in taking a reference point on the rear face of the substrate. This reference point formed during etching of the buried layer requires an optical polished rear face so that its geometrical definition is sufficient during alignment. But with the methods used, the accuracy is not even as good as before and is all the more poor that the wafer is thick, which limits its use to wafers of small diameter or to power devices in which the alignment is not very critical.

SUMMARY OF THE INVENTION

Thus, one aim of the present invention is to palliate the disadvantages outlined above of the prior art and to provide a process for forming a coffer allowing extremely precise alignment of the insulating walls with respect to the buried layer of an integrated circuit.

According to this process, before forming the epitaxial layer, there is implanted in the substrate, on the one hand, overdoped zones of the type of conductivity opposite that of the substrate and intended to serve as buried layers and, on the other hand, overdoped zones of the same type of conductivity as the substrate along the contour of the insulating walls, then, after formation of the epitaxial layer, the implanted impurities corresponding to the insulating walls are caused to diffuse as far as the surface of the epitaxied layer. Thus, the insulating walls are positioned on the same surface as that on which the buried layers have been implanted and one can use an extremely precise reference point on the two masks with respect to each other or recourse may be had to mask superimposition processes. In a subsequent step the walls may be transformed into silica walls by anodization and oxidization.

DESCRIPTION OF THE DRAWINGS

These objects, characteristics and advantages as well as others of the present invention will be discussed in more detail in the following description of particular embodiments made with reference to the accompanying figures in which:

FIGS. 1 to 4 have already been described and were intended to illustrate the state of the prior art;

FIGS. 5 to 9 illustrate steps of the coffer-forming process of the invention; and FIGS. 10 and 11 represent applications of the present invention.

DESCRIPTION OF THE PREFERRED EMBODIMENTS

FIG. 5 illustrates a first step of the process of the present invention. As in the process of the prior art, a substrate 1 of type P is used for example which is subjected to thermal oxidization.

Unlike the preceding case, there is etched in silica layer 10, in a single operation, two types of openings instead of one. In openings 21 there will be diffused the N+ buried layers and in openings 22 there will subsequently be formed the foundations of the insulating walls.

The photographic mask used comprises the patterns corresponding to the buried layers and to the insulating walls. The relative position of the two regions is then defined by the photographic definition of the mask; it is at present of the order of $0.1\mu$.

In a second step shown in FIG. 6, there is spread over silica layer 10 and its openings 21 and 22 a layer 23 of photosensitive lacquer or resin, an image is then produced on this layer through a mask comprising solely the patterns of the buried layer. These patterns are slightly enlarged, $2\mu$ for example, so as to allow their alignment with respect to the previously etched patterns.

The resin, then developed, frees openings 21 while stopping up openings 22. Then implantation of the dopant is proceeded with so as to form buried layer 12. The implantation of a dose of arsenic of $5 \times 10^{15}$ at/cm$^2$ with an energy of 100 keV allows, after diffusion, layer resistances of $10\Omega/\square$ to be obtained which are required for this kind of element.

The diffusion providing buried layer 3 is effected so as to restore the defects caused by the implantation and so as to form a thin oxide layer 24 which avoids the loss of arsenic (see FIG. 7).

FIG. 7 shows the wafer in the next step, a layer of photosensitive resin 25 covers the buried layer regions so as to limit the implantation of boron to the level of openings 22 of the wall foundations. The photographic mask used for this operation comprises patterns of the insulating walls slightly enlarged as previously; an enlargement of $2\mu$ permits a positioning tolerance of $\pm 1\mu$, but requires that on the first mask the patterns of the buried layers are spaced more than $2\mu$ from those of the insulating walls. This restriction allows however the insulating foundations to come into contact with the buried layer by lateral diffusion if it is necessary to reduce to a maximum the size of the coffers.

The implantation of foundations 26 doped with boron is then carried out, with an energy chosen so that the ions pass neither through the resin layer nor through the thicker oxide layer grown initially. An oxide layer of $1\mu$ and an energy of 200 keV allow the boron to be placed fairly deeply so as to avoid its exodiffusion during epitaxy. The thin oxide layer (50 nm) created during annealing of the buried layer may be eliminated either before or after the implantation depending on the boron dose implanted, its thickness is in any case too small to mask the implantation under the chosen conditions.

A dose of boron of $5 \times 10^{15}$ at/cm$^2$, for example, will be sufficient to obtain complete penetration through the epitaxied layer without the buried layer rising too substantially.

FIG. 8 represents the wafer after growth of the epitaxied layer and the insulating diffusions. Foundations 26 have given rise to insulating walls 2 of type P which define in the epitaxied layer of type N isolated coffers.

According to the process of the present invention, the distance between the insulating walls and the buried layer may then be narrowly controlled: these walls may be disposed as illustrated schematically in FIG. 8, or else they may be strictly associated with the buried layer or else, as is illustrated in FIG. 9, the junctions of the insulating walls may penetrate symmetrically into the lateral diffusion of the buried layer.

The characteristics of the present invention outlined above permit one object of the present invention to be reached, i.e., to accurately align the positions of the insulating walls with respect to those of the buried layers. But, for the advantage thus obtained to be effective, it is important to be able to "see" the position of the top of the insulating walls so as to permit alignment of the subsequent photo-etchings effected in each coffer.

In order to cause the top of the walls to appear, two ways are possible: either by hollowing out, by chemical selective etching according to the type of conductivity, the top of insulating walls P, or by transforming the silicon which forms them into porous silicon by anodic etching. The two processes have been tried out with success. The second process is particularly useful in the case of structures such as the one shown in FIG. 9. It is then desirable to transform the porous silicon of the walls into oxide if it is desired not to reduce excessively the insulating voltage behaviour of the coffer. A coffer is then obtained which is laterally insulated by oxide, an arrangement which allows, as is well-known, the dimensions of the elements and their spacing from the insulating walls of the coffer to be reduced.

So that the lateral insulation is of good quality, it is necessary to control the porosity of the silicon during anodization so as to limit the stresses which follow from subsequent oxidization.

The process described enables then an aligned lateral dielectric insulation to be obtained at the periphery of the buried layers; this arrangement allows in particular devices to be constructed comprising simultaneously coffers whose bottom is insulated either by the junction between the substrate and the epitaxied layer, or by that of the previously described buried layer and of the substrate.

FIG. 10 shows two adjacent coffers 30 and 31 formed in accordance with the present invention. Coffer 30 does not comprise a buried layer and contains a conventional PNP-substrate transistor. Coffer 31 comprises a buried layer 32 whose edges come into contact with the foundations of silica insulation walls 33. Coffer 31 contains a conventional vertical NPN transistor.

When these two types of transistor are used simultaneously, a difficulty generally met with arises from the fact that the operation of the PNP transistor whose collector is formed by the substrate is disturbed by the parasite PNP transistor whose emitter is formed by the base of the NPN transistor.

In conventional processes, the gain of the parasite PNP transistor thus formed depends largely on the distance between the insulating foundation and the buried layer since in this space the operation is identical to that of an authentic substrate PNP transistor. It is then evident that all relative variations of the insulation and of the buried layer will lead to considerable variations in the gain of this parasite element and so to poor operation of the integrated circuit itself. The process previously described allows this insulation/buried layer distance to be controlled exactly and so the gain of the parasite transistors.

Another application of the present invention is illustrated in FIG. 11 which represents coffers 40 having buried layers 41, adjacent insulating walls 33 made from silicon oxide. In this case, the element leading to a parasite current in the substrate may be a metal/semiconductor diode (42/43), a so-called Schottky diode. This kind of arrangement is frequently met with in programmable bipolar memories. These memories are formed from a matrix of Schottky diodes in which matrix access to each diode is formed by a metal connection not shown and which may melt under a high current. During programming of a memory point, it will be readily understood that the current which would flow on the outside of the coffer of the diode addressed could cause parasite inscriptions. Here again, the possibility of self-aligning the insulation walls with the buried layers allows memory points of very small dimensions to be formed and so operationally very reliable. These two examples show the advantage of the invention. It will moreover be understood that the embodiment which is proposed is not limiting: for example, for coffers of very small thickness ($<1\mu$), instead of depositing the epitaxied layer at a high temperature by chemical decomposition of a hydrogenated or chlorinated silicon compound, this silicon could be deposited in an amorphous form at a much lower temperature, surface annealing by means of a laser or an electron beam leading simultaneously to epitaxic recrystallization of the layer and to the diffusion of the insulations.

The present invention is not limited to the embodiments which have been more explicitly described above; it includes the different variations and generalizations thereof included within the scope of the following claims.

What is claimed is:

1. A process for aligning diffusion masks with respect to isolating walls of coffers in integrated circuits, these coffers being formed in a layer having a first type of conductivity and a thickness less than 3 microns obtained by epitaxial growth on a substrate having a second type of conductivity in which there are implanted, in zones corresponding to the bottom of the coffers, doping impurities of the first type of conductivity, these coffers being limited laterally by isolating walls; the improvement comprising implanting doping impurities of the second type of conductivity in the substrate along the contour of the isolating walls and then after formation of the epitaxial layer in causing these impurities to diffuse towards and as far as the surface of the epitaxial layer; and further comprising the step which consists in making the upper surface flush zone of the insulating walls visible at the surface of the epitaxial layer in order to facilitate alignment.

2. The process as claimed in claim 1, wherein the thickness of the epitaxial layer is less than 1 micron.

3. The process as claimed in claim 1, comprising the further steps of anodizing the wafers so as to transform the isolating walls made of monocrystalline silicon having the same type of conductivity as the substrate, into porous silicon, then of proceeding with an oxidizing treatment so as to transform the porous silicon into silica.

4. The process as claimed in claim 3, wherein the foundations of the isolating walls are disposed so as to come laterally into contact with the periphery of the buried layer having the first type of conductivity, after diffusion.

5. The process as claimed in claim 4 further comprising forming adjacent coffers and the forming an NPN transistor in one of the coffers and a PNP-substrate transistor in the adjacent coffer.

6. The process as claimed in claim 1, comprising the further step of submitting the surface of the wafer to chemical etching, selective according to the type of conductivity.

7. The process as claimed in claim 1, wherein the first doping impurities are arsenic and the second boron.

* * * * *